United States Patent [19]
Ong et al.

[11] Patent Number: 6,078,513
[45] Date of Patent: Jun. 20, 2000

[54] NMOS DYNAMIC CONTENT-ADDRESSABLE-MEMORY CAM CELL WITH SELF-BOOTING PASS TRANSISTORS AND LOCAL ROW AND COLUMN SELECT

[75] Inventors: Adrian E. Ong, Pleasanton; Deepraj S. Puar, Sunnyvale, both of Calif.

[73] Assignee: NeoMagic Corp., Santa Clara, Calif.

[21] Appl. No.: 09/375,979

[22] Filed: Aug. 16, 1999

Related U.S. Application Data

[63] Continuation-in-part of application No. 09/328,957, Jun. 9, 1999.

[51] Int. Cl.[7] .............................. G11C 15/00; G11C 16/04
[52] U.S. Cl. ........................................ 365/49; 365/189.07
[58] Field of Search ................................ 365/49, 189.07

[56] References Cited

U.S. PATENT DOCUMENTS

| | | | |
|---|---|---|---|
| 3,744,037 | 7/1973 | Spence | 340/173 |
| 4,308,594 | 12/1981 | Jiang | 365/187 |
| 4,935,896 | 6/1990 | Matsumura et al. | 365/187 |
| 4,959,811 | 9/1990 | Szczepanek | 365/49 |
| 5,185,721 | 2/1993 | Love et al. | 365/189 |
| 5,414,656 | 5/1995 | Kenney | 365/149 |
| 5,452,243 | 9/1995 | Ansel et al. | 365/49 |
| 5,515,327 | 5/1996 | Matsukawa et al. | 365/203 |
| 5,572,469 | 11/1996 | Anami et al. | 365/189.11 |
| 5,657,264 | 8/1997 | Yamauchi et al. | 365/49 |
| 5,841,690 | 11/1998 | Shibutani et al. | 365/149 |
| 5,841,706 | 11/1998 | Umezaki et al. | 365/189.11 |
| 5,872,737 | 2/1999 | Tsuruda et al. | 365/189.05 |

*Primary Examiner*—Trong Phan
*Attorney, Agent, or Firm*—Stuart T. Auvinen

[57] ABSTRACT

A content-addressable memory (CAM) cell isolates the gate nodes of pass transistors during a write operation. Select transistors between the word line and the pass-transistor gates are driven high by a column-select signal. The bit lines are precharged low. The word line is driven high to Vcc, and the select transistors drive the pass-transistor gates to Vcc-Vtn. One of the bit lines is then driven high to Vcc while the other bit line is held low. As the bit line swings high, capacitive coupling drives one of the pass-transistor gate nodes higher, above Vcc-Vtn. The select transistor then isolates the gate node from the word line. As the bit line continues to swing high, more coupling drives the gate node above Vcc. The boosted gate-node voltage increases the current drive of the pass transistor, accelerating the write operation. When the word line drop to ground, the select transistors drain the gate nodes, disabling the pass transistors and dynamically storing charge on the gates of storage transistors. The drains of the storage transistors are connected to a match line through a pair of match transistors. The gates of the match transistors are connected to the bit lines. The match transistors and storage transistors form an exclusive-OR (XOR) function with two series connections to the match line. When both a match transistor and a storage transistor in series are on, the match line is discharged, indicating a mis-match.

20 Claims, 5 Drawing Sheets

NMOS DYNAMIC CONTENT-ADDRESSABLE-MEMORY CAM CELL WITH SELF-BOOTING PASS TRANSISTORS AND LOCAL ROW AND COLUMN SELECT

RELATED APPLICATION

This application is a continuation-in-part of the co-pending application for "A Reduced-Pitch 6-Transistor NMOS Content-Addressable-Memory Cell", U.S. Ser. No. 09/328,957, filed Jun. 6, 1999.

FIELD OF THE INVENTION

This invention relates to NMOS semiconductor memories, and more particularly to content-addressable memory (CAM) cells.

BACKGROUND OF THE INVENTION

Content-addressable memory (CAM) cells are frequently used. CAM cells perform RAM functions (writing and storing data), but also test or compare the stored data to determine if the data matches test data applied to the memory. When the newly-applied test data matches the data already stored in the memory, a match line is activated, indicating that the stored data matches the test data. CAMs are especially useful for fully-associative memories such as look-up tables and memory-management units.

Each CAM cell is essentially a RAM cell with a match function. Match functions can be implemented by adding an exclusive-OR (XOR) or inverse XOR gate to each RAM cell. The XOR output is applied to a match line that connects many CAM cells together in a row or column. The match signal can then be output from the memory.

CAM cells were originally constructed from static RAM (SRAM) cells by adding transistors to perform the XOR function. More recently, CAM cells have also been constructed from dynamic RAM (DRAM) cells. DRAM cells have an area and cost advantage over SRAM cells since a small capacitor stores charge rather than a bi-stable or cross-coupled pair of transistors.

Dynamic Cam Cells—FIG. 1

FIG. 1 shows a prior-art dynamic CAM cell using six transistors. U.S. Pat. No. 5,428,564 by Winters shows a six-transistor (6T) CAM cell based on earlier dynamic CAM cells of just 4 or 5 transistors. While the earlier 4T and 5T CAM cells were small in area, these cells were particularly noise sensitive and slow, having relatively low voltage ratios.

Winter's CAM cell is written by raising the voltage on the write line, which activates pass transistors 12, 14. True and complement data are applied to bit lines BL and BLB, which are passed through pass transistors 12, 14 to store charge on the gates of storage transistors 18, 16. The sources of storage transistors 16, 18 are also connected to bit lines BL, BLB so that an additional voltage difference from gate to source is created, increasing the stored charge. For example, when BL is high and BLB is low, the high voltage from BL is transmitted to the gate of storage transistor 18, while the low voltage from BLB is applied to the source of storage transistor 18. At the same time, the low voltage from BLB is transmitted to the gate of storage transistor 16, while the high voltage from BLB is applied to the source of storage transistor 16. Thus storage transistors 16, 18 are charge oppositely during a write. Inverse read signal RD-NOT is high during write, and diode transistor 10 stays off so that the drains of storage transistors 16, 18 do not discharge the bit lines.

During a read, signal RD-NOT is low, and diode transistor 10 pulls low the drains of storage transistors 16, 18. One of bit lines BL, BLB is pulled low, depending on which of storage transistors 16, 18 has its gate charged high during the last write. The cell's data can then be read as a voltage difference across the bit lines using a sense amplifier. The CAM cell can be periodically refreshed by reading and then writing back the data to the cell.

During a compare or match operation, match line MATCH and RD-NOT are high and WRITE is low. The bit lines BL and BLB are precharged low. One of the bit lines is then pulled high with the test data. When the test data matches the stored data, storage transistor 16 or 18 connected to the raised bit line is off, preventing the drains from being charged high. The low voltage is applied to the gate of match transistor 20, which does not turn on, keeping MATCH high. When the test data mismatches the stored data, the storage transistor 16 or 18 connected to the raised bit line is turned off, charging high the drains of storage transistors 16, 18. The high drain voltage is applied to the gate of match transistor 20, turning it on, discharging MATCH low.

Winter's CAM cell uses only n-channel (NMOS) transistors, and has a small area. However, bit-line capacitance is high, since the sources of storage transistors 16, 18 are connected directly to the bit lines, as are pass transistors 12, 14. The high bit-line capacitance slows read and write operations. Also, there is the danger of sub-threshold leakage through storage transistors 12, 14 and of disturbance of the storage node from the bit lines. Another disadvantage is the layout efficiency in the MATCH/WL direction. The pitch in this direction may be greater than desired. The gate voltage of transistor 20 can only go as high as VCC-Vt; thus its current drive is weak.

Cmos Dynamic Cam Cell—FIG. 2

FIG. 2 is a prior-art dynamic CAM cell using CMOS transistors. See U.S. Pat. No. 4,791,606 by Threewitt et al. A single bit of data is stored on capacitor 28 when pass transistor 22 is activated by word line WL. Only one bit line BL is used.

An XOR gate is formed by n-channel transistors 24, 28 and p-channel transistors 21, 23. The stored data from capacitor 28 is applied to the gates of transistors 23, 26, while the bit line BL drives the gates of transistors 21, 24. The source of n-channel transistor 26 and the drain of n-channel transistor 23 are driven by mask line MASK, which is pulled low when the CAM cell is being compared. MASK can be pulled high to mask off or disable some cells from being compared. The drain of n-channel transistor 24 and the source of n-channel transistor 21 are connected to match line MATCH.

During a compare or match operation, the inverse data is applied to bit line BL, which is sometimes designated BL/CB to indicate that true data is applied during write, but complement data during compare. Word line WL is kept low so pass transistor 22 is off. Thus the stored data is applied to the gates of transistors 23, 26, while the complement of the test data is applied to the gates of transistors 21, 24 from the bit line. When the stored data and the complement data driven to BL do not match, one of transistors 24, 26 in series is on and the other is off. Likewise, one of transistors 21, 23 is on and the other is off. Thus neither series connection has both transistors on, and the match line is not discharged low to MASK, which is driven low during compare. Thus a match is signaled.

When the stored data does match the complement data on BL, the match line is pulled low (a mis-match). If the stored data is high and BL is high, n-channel transistors 24, 26 are both on but p-channel transistors 21, 23 are both off. MATCH is discharged through n-channel transistors 24, 26. For low stored data and BL low, p-channel transistors 21, 23 discharge MATCH.

All-Nmos Cam Cell—FIG. 3

The parent application describes a CAM cell that uses only n-channel transistors. It uses dynamic storage rather than static storage, reducing the size of the CAM cell. A compact layout for the NMOS dynamic CAM cell was also shown.

FIG. 3 is a diagram of a dynamic differential CAM cell with just 6 NMOS transistors as described in the parent application. This CAM cell stores one bit of data, but the data is stored differentially as true and complement data.

A pair of bit lines BL, BLB carry true and complement data to a column of cells. Pass transistors 32, 42 are turned on when word line WL is driven with a high voltage during a write operation. Pass transistors 32, 42 connect bit lines BL, BLB to the gates of storage transistors 36, 46. One gate is charged high while the other gate is charged low. For a data 1, bit line BL is high, storing a high voltage on the gate of storage transistor 36. Bit line BLB is low, driving a low voltage on the gate of storage transistor 46. When word line WL is driven low, storage transistor 36 stores a positive charge while storage transistor 46 stores little or no charge. The opposite occurs when a data 0 is written to the cell.

Match line MATCH is held low during reads and writes so that storage transistors 34, 44 act as capacitors to ground. The sources of storage transistors 36, 46 are connected to ground. A virtual or switched ground such as a MASK line can be substituted. MATCH is precharged high before a compare operation.

The cell can be read by equalizing and precharging both bit lines BL, BLB to an intermediate voltage before word line WL is raised. One bit line is then driven low and the other is driven high by charge sharing as pass transistors 32, 42 are turned on. A sensitive sense amplifier can then detect a slight voltage difference on bit lines BL, BLB. The cell can be refreshed by writing the sensed data back to the bit lines.

N-channel transistors 34, 36, 44, 46 perform an XOR function since true and complement data are stored on the gates of storage transistors 36, 46. During a match or compare operation, word line WL is low and pass transistors 32, 42 remain off. Thus the stored charge on the gates of storage transistors 34, 44 is isolated and not disturbed.

The test data from bit lines BL, BLB are applied to the gates of match transistors 34, 44, respectively. The complements of the test data are applied to these bit lines during the compare operation. Thus bit line BL carries the complement of the test data, and can be designated BL/CB, where CB refers to the inverse compare data or compare-bar. Complement bit line BLB carries the true test data, and can be designated BLB/C.

The stored data or stored charge on the gate of storage transistor 36 turns this transistor on when high but off when the data (charge) is low. When the test data is low (a mis-match), the test-data complement CB is high, and thus a high signal is applied to bit line BL/CB. Both transistors 34, 36 are turned on, causing match line MATCH to be discharged to ground. Thus a mis-match is signaled.

MATCH is also pulled low when the stored data is high but the test data is low. The low stored data causes the gate of storage transistor 36 to be low, keeping it off. However, the gate of storage transistor 46 is charged high, turning it on. Bit line BLB receives the true test data (high), which is applied to the gate of transistor 44, turning it on. Since both transistors 44, 46 are turned on, the MATCH line is discharged through these series-connected transistors. A mismatch is signaled.

When the test data matches the stored data in the CAM cell, match line MATCH remains high. For example, when the cell stores a 1, storage transistor 36 is on but storage transistor 46 is off. The true test data is applied to bit line BLB while the complement test data is applied to bit line BL. Since the test data is also a 1, BL is low while BLB is high. Thus transistor 34 is off, blocking current flow through storage transistor 36. Thus no discharge path to ground occurs, since transistors 34, 46 are off.

The opposite occurs when the cell stores a 0, which is compared to a 0 test data.

The CAM cell requires only 6 transistors. Since all 6 transistors are NMOS, the cell does not have to expand for well-to-well spacing as only a P-well or p-substrate is present within the cell. Of course, a full CMOS process may be used for the periphery circuits.

FIG. 4 is another alternate embodiment described in the parent application with write-enable transistors. Write-enable transistors 31, 41 are added in series with pass transistors 32, 42. The cell can be written but not read. Some applications such as imaging do not require reading since the data is not stored for more than the refresh period. Instead, the data is quickly used (compared but not read) and discarded.

While the parent application's CAM cell is area-efficient, using only n-channel transistors, a full voltage swing on the word or row lines is needed to access the cell. Word-line drivers using charge pumps could be used to elevate the word-line voltage above the power-supply voltage, but these pump circuits are complex. It is desired to modify the CAM cell described in the parent application to increase the voltage on the gate of the pass transistors, without using a charge pump. Using locally-pumped nodes for pass transistors allows for higher voltage-drive without external charge pumps. Smaller device sizes can be used for the pass transistors while still allowing sufficient current to flow when charging or discharging the dynamic nodes of the CAM cell.

What is desired is a CAM cell with locally-pumped pass-transistor gates. It is desired to use only n-channel transistors. It is desired to use dynamic storage rather than static storage to reduce the size of the CAM cell. A dynamic CAM cell is desired that pumps the pass-transistor gate voltage above the power-supply voltage without using a word-line charge pump. A compact layout for an NMOS dynamic CAM cell is also desired.

SUMMARY OF THE INVENTION

A self-booting memory cell with a compare gate has a pair of bit lines including a true bit line and a complement bit line. They are for conducting a data bit and a complement of the data bit to the memory cell. A word line indicates when to write data from the bit lines to a row containing the memory cell. A column-select line indicates when to write data from the bit lines to a column containing the memory cell.

A first storage transistor has a first gate for dynamically storing a state of the memory cell. A second storage transistor has a second gate for dynamically storing a complement of the state of the memory cell. A first pass transistor has a gate controlled by a first boosted node. It connects the true bit line to the first gate during a write operation. A second pass transistor has a gate controlled by a second boosted node. It connects the complement bit line to the second gate during the write operation.

A first select transistor is coupled between the word line and the first boosted node and has a gate controlled by the column-select line. It isolates the first boosted node from the word line when the column-select signal is low. A second select transistor is coupled between the word line and the second boosted node, with a gate controlled by the column-select line. It isolates the second boosted node from the word line when the column-select signal is low.

A first match transistor are coupled to the first storage transistor. It discharges current from the match line to the first storage transistor during a compare operation. Its gate is controlled by a first bit line of the pair of bit lines. The first bit line receives a test data bit during the compare operation. A second match transistor is coupled to the second storage transistor. It discharges current from the match line to the second storage transistor during the compare operation. Its gate is controlled by a second bit line of the pair of bit lines. The second bit line receives a complement of the test data bit during the compare operation. Thus the first and second storage transistor and the first and second match transistor are a compare gate.

In further aspects the first select transistor is further for isolating the first boosted node from the word line during a write to the CAM cell. When the true bit line swings from a low voltage to a high voltage, the true bit line capacitivly couples a voltage boost into the first boosted node. The voltage boost drives the first boosted node above a high voltage of the column-select line to turn off the first select transistor means. The second select transistor is further for isolating the second boosted node from the word line during a write to the CAM cell. When the true bit line swings from a low voltage to a high voltage, the true bit line capacitivly couples a voltage boost into the second boosted node. The voltage boost drives the second boosted node above a high voltage of the column-select line to turn off the second select transistor. Thus the first or second boosted node is boosted above a high voltage of the column-select line to isolate a boosted gate from the word line.

In further aspects the column-select line is driven to a power-supply voltage as the high voltage. The first boosted node is boosted above the power-supply voltage by capacitive coupling from the true bit line. Thus the first boosted node is boosted above the power-supply voltage by a bit line.

DETAILED DESCRIPTION

The present invention relates to an improvement in content-addressable memory (CAM) cells. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a higher voltage on the gates of the pass transistors increases the current drive of the pass transistors, allowing smaller-size transistors to be used, or providing faster write-access times. Often, word lines are driven by charge-pump drivers, providing a word-line voltage above the power-supply voltage. The word lines are directly connected to the gates of the pass transistors, thus applying the pumped voltage directly to the pass-transistor gates.

The inventors have also realized that the CAM cell disclosed in the parent application can be modified to provide a local gate node that can be pumped above the power supply. When a select transistor is placed in series between the word line and the gate of the pass transistor, the gate node may be isolated and pumped. A voltage swing on the bit line capacitivly couples into the gate node, raising the gate-node voltage. As the gate-node voltage rises above the word-line voltage, the select transistor shuts off, isolating the gate node from the word line.

Figure 1:
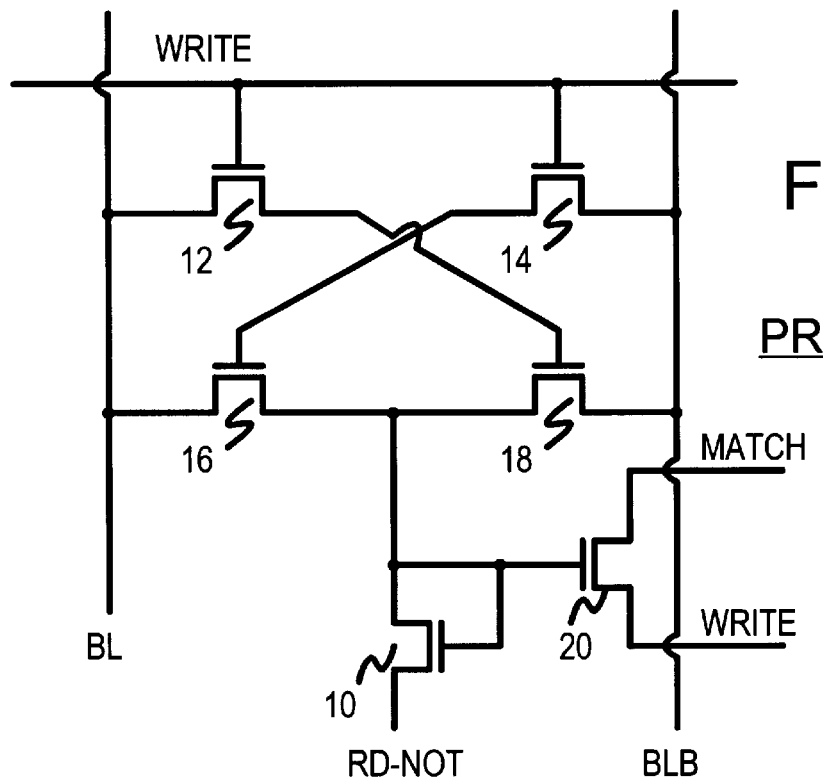
FIG. 1 shows a prior-art dynamic CAM cell using six transistors.
Figure 2:
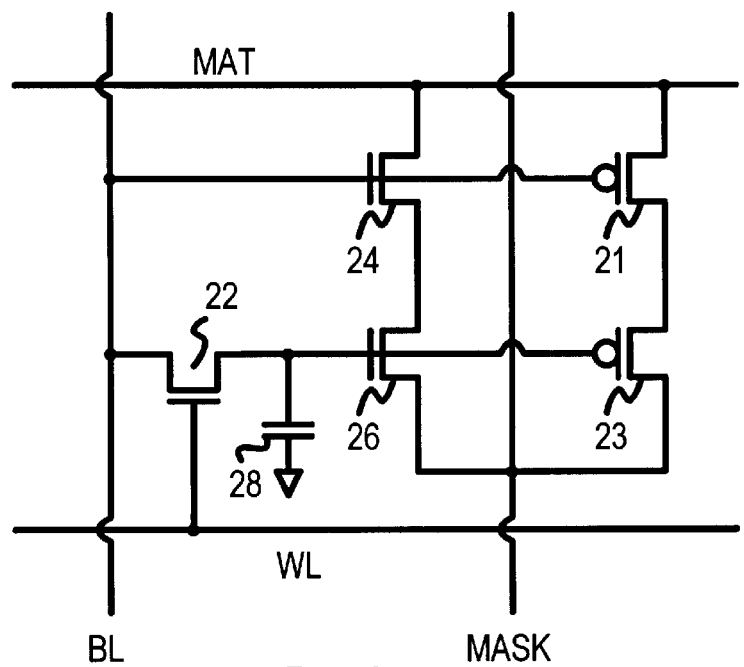
FIG. 2 is a prior-art dynamic CAM cell using CMOS transistors.
Figure 3:
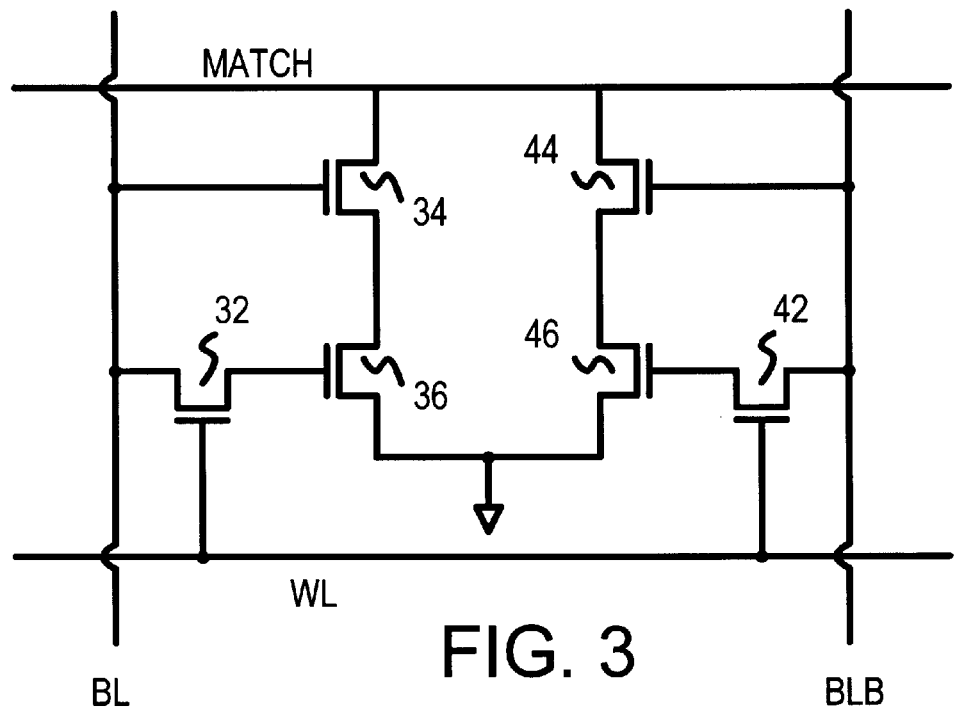
FIG. 3 is a diagram of a dynamic differential CAM cell with just 6 NMOS transistors as described in the parent application.
Figure 4:
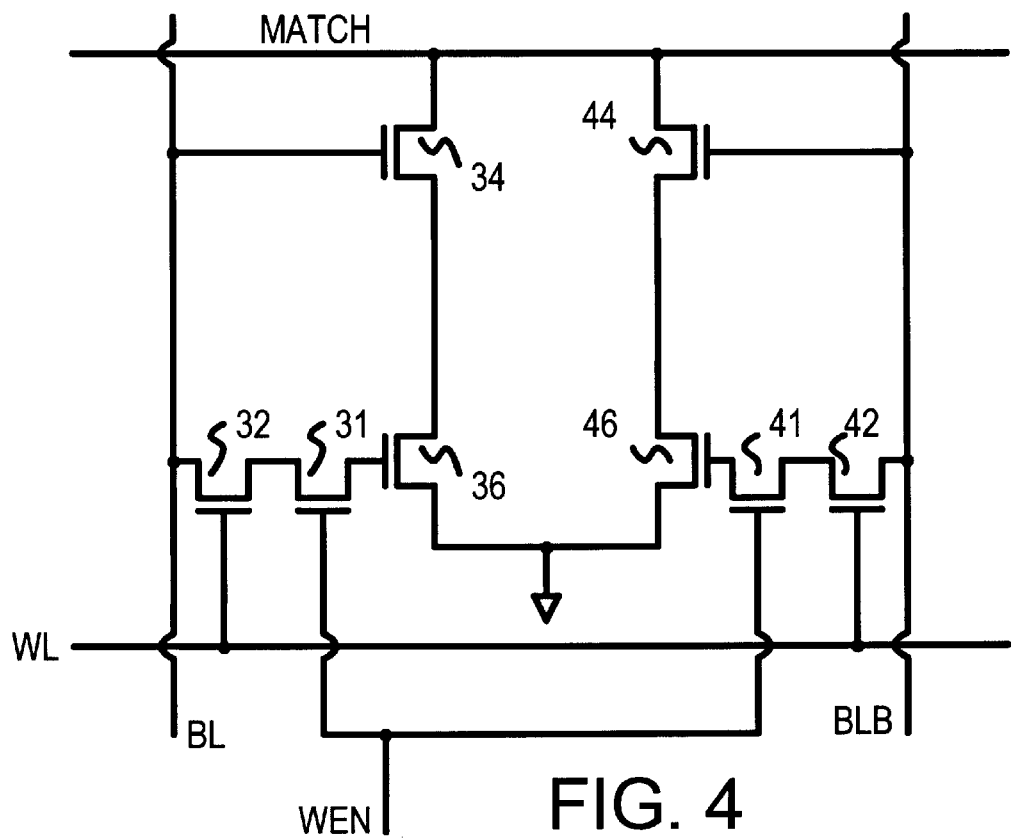
FIG. 4 is another alternate embodiment described in the parent application with write-enable transistors.
Figure 5:
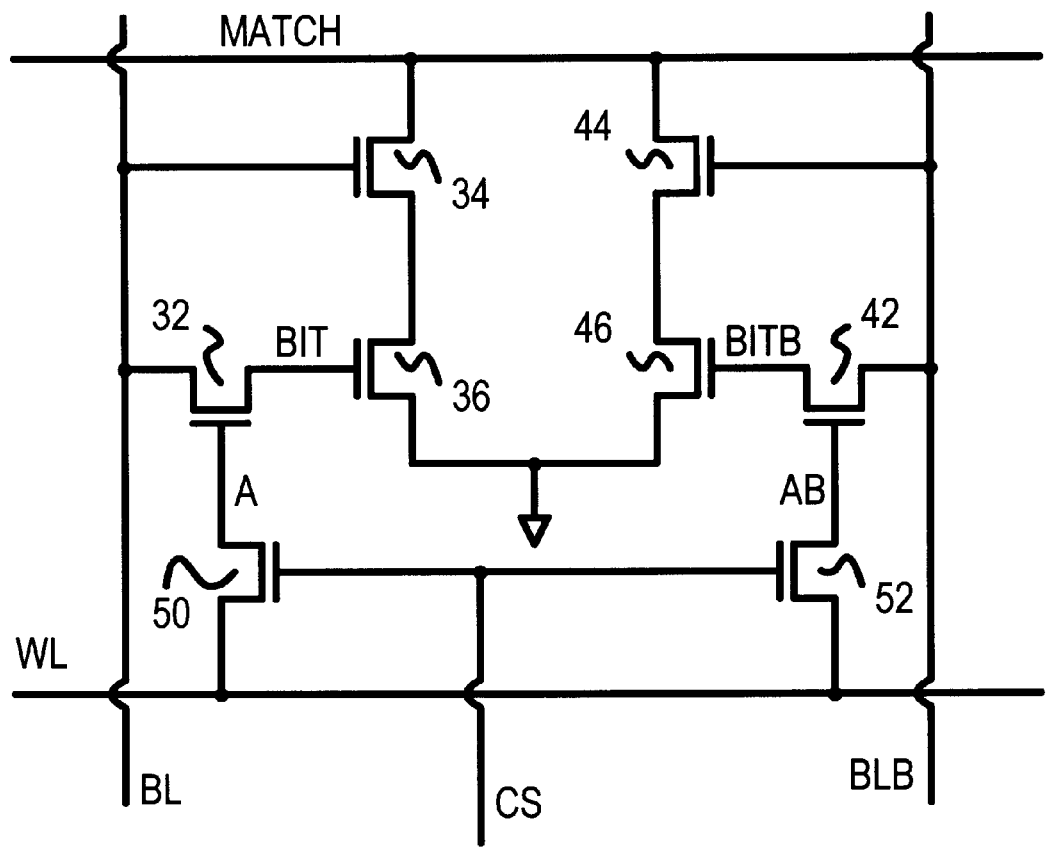
FIG. 5 is a diagram of a self-booting dynamic differential NMOS CAM cell.

FIG. 5 is a diagram of a self-booting dynamic differential NMOS CAM cell. This CAM cell stores one bit of data, but the data is stored differentially as true and complement data.

A pair of bit lines BL, BLB carry true and complement data to a column of cells. Column-select CS is high to select a column of cells for access, turning on select transistors 50, 52. De-selected columns have CS low, decoupling word line WL from the cell. CS is normally high before a cell access operation begins and WL is low, ensuring that pass transistors 32, 42 are completely off. Thus select transistors 50, 52 connect word line WL to the gates of pass transistors 32, 34.

To write, CS of the selected cells remain high while CS of the unselected cells go low. WL then goes high and charges the gate of transistors 32, 42 (node A and AB) to VD-DVt32 and VDD-Vt42 respectively. BL and BLB are initially precharged to GND, so when node A and AB are charged up, the data stored in BIT and BITB is discharged to ground immediately. After nodes A and AB are charged up, one of the bitlines (BL or BLB depending on the data to be stored) goes high coupling the corresponding gate (node A or AB) to VDD-Vt+VDD less a parasitic. This allows a higher voltage to be stored into the cell. CS could be boosted to (>VDD+Vt) by external voltage or charge pump. This allows for a higher boot voltage at node A or AB, which in turn allows for full "1" to be written into BIT or BITB.

Pass transistors 32, 42 are turned on for selected columns when word line WL is driven with a high voltage during a write operation. Pass transistors 32, 42 connect bit lines BL, BLB to the gates of storage transistors 36, 46. One gate is charged high while the other gate is charged low. For a data 1, bit line BL is high, storing a high voltage on the gate of storage transistor 36. Bit line BLB is low, driving a low voltage on the gate of storage transistor 46. When word line WL is driven low, storage transistor 36 stores a positive charge while storage transistor 46 stores little or no charge. The opposite occurs when a data 0 is written to the cell.

Match line MATCH is held low during reads and writes so that storage transistors 34, 44 act as capacitors to ground.

The sources of storage transistors 36, 46 are connected to ground. A virtual or switched ground such as a MASK line can be substituted. MATCH is precharged high before a compare operation.

N-channel transistors 34, 36, 44, 46 perform an XOR function since true and complement data are stored on the gates of storage transistors 36, 46. During a match or compare operation, word line WL is low and pass transistors 32, 42 remain off. Thus the stored charge on the gates of storage transistors 34, 44 is isolated and not disturbed.

The test data from bit lines BL, BLB are applied to the gates of match transistors 34, 44, respectively. The complements of the test data are applied to these bit lines during the compare operation. Thus bit line BL carries the complement of the test data, and can be designated BL/CB, where CB refers to the inverse compare data or compare-bar. Complement bit line BLB carries the true test data, and can be designated BLB/C.

The stored data or stored charge on the gate of storage transistor 36 turns this transistor on when high but off when the data (charge) is low. When the test data is low (a mis-match), the test-data complement CB is high, and thus a high signal is applied to bit line BL/CB. Both transistors 34, 36 are turned on, causing match line MATCH to be discharged to ground. Thus a mis-match is signaled.

MATCH is also pulled low when the stored data is high but the test data is low. The low stored data causes the gate of storage transistor 36 to be low, keeping it off. However, the gate of storage transistor 46 is charged high, turning it on. Bit line BLB receives the true test data (high), which is applied to the gate of transistor 44, turning it on. Since both transistors 44, 46 are turned on, the MATCH line is discharged through these series-connected transistors. A mismatch is signaled.

When the test data matches the stored data in the CAM cell, match line MATCH remains high. For example, when the cell stores a 1, storage transistor 36 is on but storage transistor 46 is off. The true test data is applied to bit line BLB while the complement test data is applied to bit line BL. Since the test data is also a 1, BL is low while BLB is high. Thus transistor 34 is off, blocking current flow through storage transistor 36. Thus no discharge path to ground occurs, since transistors 34, 46 are off. The opposite occurs when the cell stores a 0, which is compared to a 0 test data.

The CAM cell requires only 8 transistors. Since all 8 transistors are NMOS, the cell does not have to expand for well-to-well spacing as only a P-well or p-substrate is present within the cell. Of course, a full CMOS process may be used for the periphery circuits.

Figure 6:
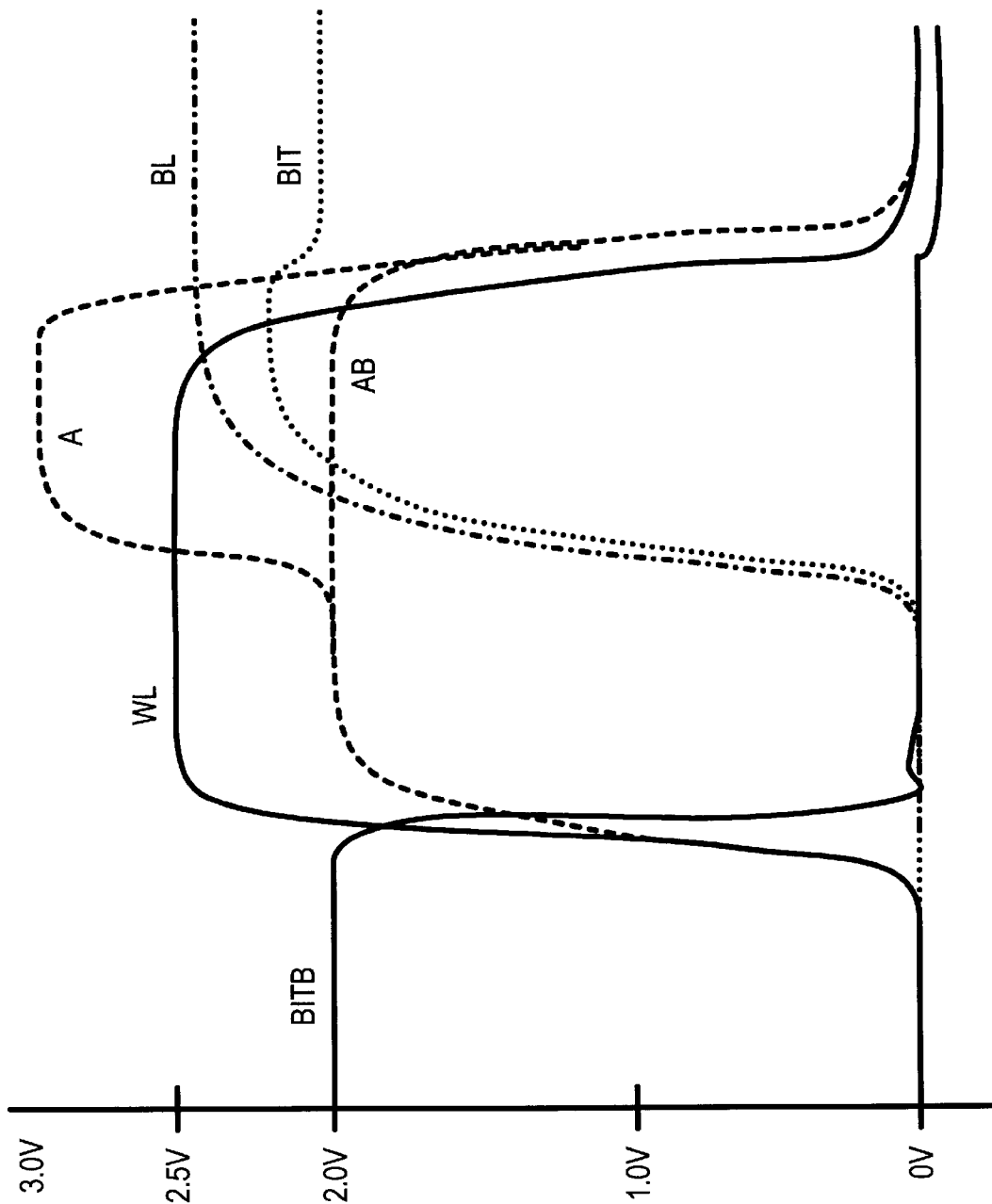
FIG. 6 shows a waveform of a self-booting write operation for the CAM cell of FIG. 5.

Self-Booting Operation—FIG. 6

A self-booting operation is performed when the cell is written. Gate nodes A, AB are boosted above the power-supply voltage during write operations. The boosted pass-gate voltage increases the current drive through pass transistors 32, 42, increasing the write speed.

FIG. 6 shows a waveform of a self-booting write operation for the CAM cell of FIG. 5. As a write operation begins, column select CS (not shown) is already high, driven to the power-supply voltage (Vcc, 2.5 volts in this example). Both bit lines BL, BLB have already been precharged to ground (discharged).

The CAM cell is initially storing a "0" since the gate of storage transistor 36 (node "BIT") is low (at ground) while the gate of storage transistor 46 is high (node "BITB"). Node BITB is at 2.0 volts rather than the full power-supply voltage of 2.5 volts due to a voltage loss through pass transistor 42 during the last write operation, and perhaps due to leakage of the dynamic-node charge.

As the write operation begins, word line WL is driven from ground to Vcc, 2.5 volts. Both CS and WL are at the same high voltage, so select transistors 50, 52 conduct the high word-line voltage to gate nodes A, AB. Since both bit lines BL, BLB are low, storage node BITB is also pulled low through pass transistor 42. Node BIT which was already low remains low. Thus both of the cell's storage nodes BIT, BITB are pulled low to ground.

Since CS and WL are at the same high voltage, select transistors 50, 52 continue to raise the voltage of gate nodes A, AB. However, since select transistors 50, 52 are n-channel transistors, nodes A, AB are driven only to a threshold below the word-line voltage, or to Vcc-Vtn. Thus gate nodes A, AB are driven to about 2.0 volts. Select transistors 50, 52 then shut off in the saturation mode, since the gate and drain voltages are equal, and the source voltage is exactly one threshold below the gate voltage. However, gate nodes A, AB remain at about 2.0 volts. Pass transistors 32, 42 remain on since the bit lines BL, BLB are still at ground. Storage nodes BIT, BITB are also at ground.

The column bit-line drivers (not shown) are then enabled to drive the write data onto bit lines BL, BLB. A logic "1" is being written to the CAM cell by driving bit line BL high while bit line BLB is still held low at ground. The bit line BL is driven from ground to Vcc, a voltage swing of 2.5 volts. This large voltage swing of bit line BL is partially coupled into gate node A by capacitive coupling through the drain-to-gate capacitance of pass transistor 32.

Since select transistor 50 is saturated, any increase in the gate-node voltage further shuts off select transistor 50. As the gate node A rises above the gate (CS) of select transistor 50, the word-line terminal of select transistor 50 becomes its source, and the gate-to-source voltage is zero since both gate and source are at Vcc. Select transistor 50 thus remains off, isolating gate node A from the large word-line capacitance.

Gate node A is constructed to be as small as possible, reducing the parasitic wiring capacitance. This improves the capacitive coupling ratio, which increases the amount of the bit-line voltage swing that is coupled into gate node A. FIG. 6 shows gate node A rising to about 3.0 volts, which is half a volt above the power supply. The voltage swing coupled into gate node A is 1.0 volt (3.0–2.0 volt ), since gate node A was already at 2.0 volt when the bit-line swing began. This is a coupling ratio of 0.4 (1.0/2.5).

The boosted gate voltage of gate node A increases the current drive of pass transistor 32, increasing the write speed. Storage node BIT, the gate of storage transistor 36, is pulled up from ground to slightly below the bit-line BL voltage. Since the gate of pass transistor 32 is boosted, pass transistor 32 remains in the linear region for most or all of the time that node BIT is being charged. Thus storage node BIT follows the rise of bit line BL.

At the end of the write operation, word-line WL is driven low to ground. Select transistors 50, 52 turn on, discharging gate nodes A, AB to ground. Column-select CS remains high. As gate node A and AB falls, pass transistors 32, 42 turn off. Some coupling occurs to storage nodes BIT, BITB, which fall by as much as a few tenths of a volt. However, storage node BIT remains slightly above 2.0 volts, providing a significant initial stored charge in the CAM cell.

The bit line BL continues to be driven high as word-line WL turns off. This keeps the stored voltage as high as possible. Once WL is low, bit line BL can be discharged in preparation for the next write operation.

Figure 7:
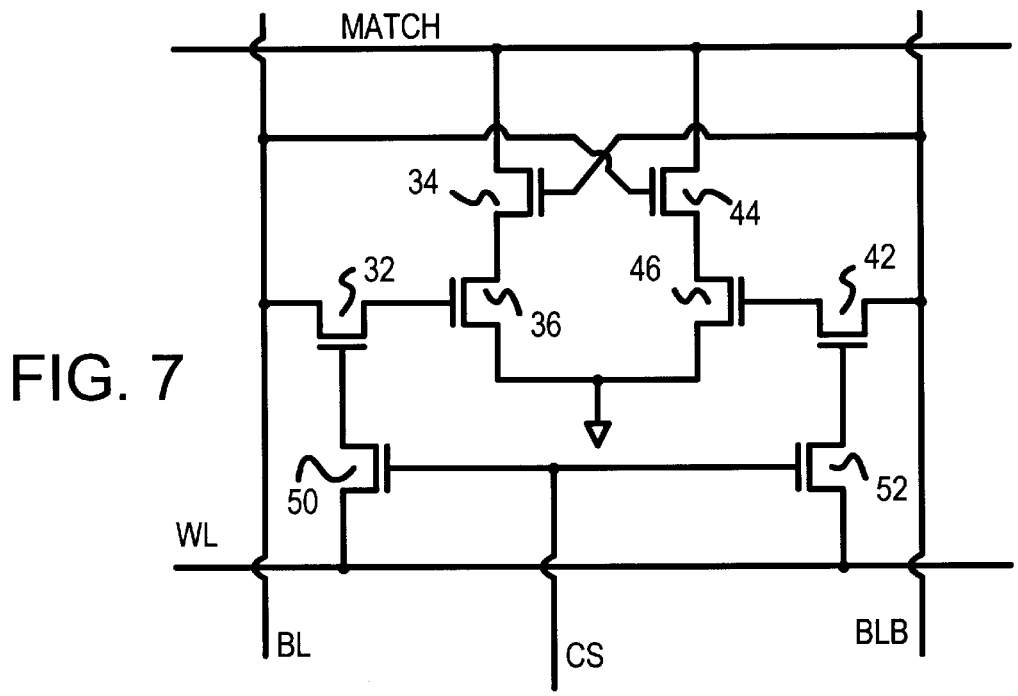
FIG. 7 shows a self-booting CAM cell with a cross-connection of the bit lines to the match transistors.

Cross-Connected Cam Cell—FIG. 7

FIG. 7 shows a self-booting CAM cell with a cross-connection of the bit lines to the match transistors. One disadvantage of the cell of FIG. 5 is that the opposite data must be applied to the bit lines during compare than was applied during writing. The cross-connected cell of FIG. 7 overcomes this problem. The gate of match transistor 34 is driven by complement bit line BLB rather than by BL. Similarly, the gate of match transistor 44 is driven by bit line BL rather than by BLB.

Since match transistor 34 is in series with storage transistor 36, MATCH is pulled low when the cell stores a 1 and BLB is high, or when the cell stores a 0 and BL is high. Otherwise MATCH remains high. The writing and reading of the cell operate in the same manner as described earlier for the cell of FIG. 5.

A match occurs when BL matches the cell's stored data. MATCH is left high when the cell stores a 1 and BLB is low, or when the cell stores a 0 and BL is low. Thus bit line BL carries the true test data, and can be designated BL/C. BLB carries the complement test data and can be designated BLB/CB.

While the cross-connected cell is simpler to operate, the area may be increased. The layout requires a cross-over for the bit lines to the gates of the match transistors. This cross-over may require additional area in some layouts. In one embodiment, pass transistors 32, 42 are 1 micron in width, while storage transistors 36, 46 and match transistors 34, 44 are 2 microns in width.

Figure 8:
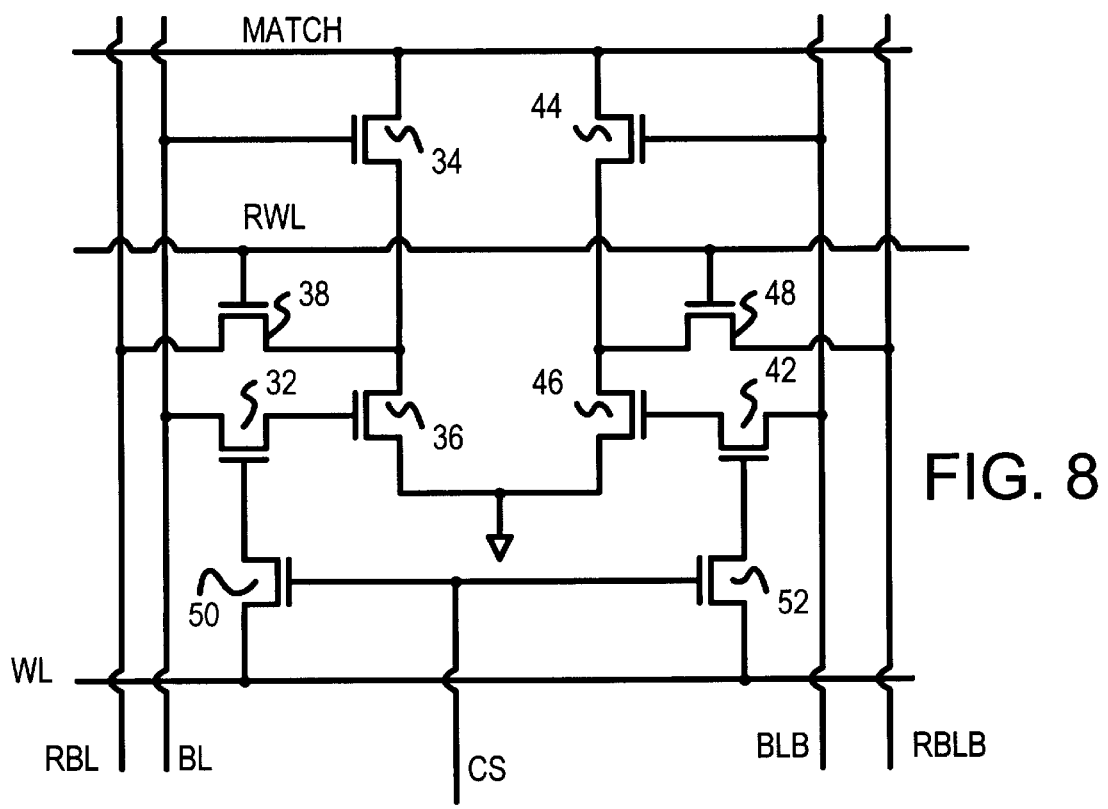
FIG. 8 shows a dynamic self-booting CAM cell with an additional pair of read bit lines and read pass transistors.

Cam Cell With Separate Read Port—FIG. 8

FIG. 8 shows a dynamic self-booting CAM cell with an additional pair of read bit lines and read pass transistors. The CAM cell operates in much the same manner as described earlier for the cell of FIG. 5. However, reading is performed using a dedicated read port. The cell is useful as a FIFO cell since separate read and write ports are provided, allowing asynchronous reads and writes. Since read is possible, this dynamic cell may also be refreshed.

Read pass transistors 38, 48 are activated by read word line RWL during a read operation. Pass transistors 32, 42 are kept off during a read since write word line WL is kept low. Read pass transistor 38 is connected to the source of match transistor 38 and to the drain of storage transistor 36. Read pass transistor 48 is connected to the source of match transistor 48 and to the drain of storage transistor 46.

Since read pass transistors 38, 48 are not connected to the gates of storage transistors 36, 46, the stored charge is not disturbed by the read operation. Instead, one of storage transistors 36, 46 drains charge from one of the read bit lines when read pass transistors 38, 48 are activated. The read bit lines RBL, RBLB can be equalized and precharged before RWL is activated. The read bit lines can be precharged either high or low, but high is preferred.

For example, when the cell stores a 1, storage transistor 36 is on but storage transistor 46 is off. When read pass transistors 38, 48 are turned on, storage transistors 36, 46 are connected to read bit lines RBL, RBLB. Storage transistor 36 then sinks charge from read bit line RBL through read pass transistor 38, lowering its voltage. Since storage transistor 46 is off, the other read bit line RBLB remains high. A voltage difference begins to occur between the read bit lines, and can be amplified by a sense amplifier.

The write bit lines can both be kept low during the read operation. Column-select CS is kept high or low. The match line is also driven low. Simultaneous reads and writes are also possible when reads and writes are to different rows. During simultaneous read/write operation, MATCH is precharged low. The write bit lines are driven while WL is on, and at the same time RWL is on and data is driven onto the Read bit lines.

In one embodiment, pass transistors 32, 42 are 1 micron in width, while storage transistors 36, 46 and match transistors 34, 44 are 1.4 microns in width. Read pass transistors 38, 48 are 2 microns in width. The gate length is 0.25 micron.

Advantages of The Invention

Differential writing, reading, and sensing are faster than single-ended sensing. Providing a pair of bit lines rather than just one bit line provides significant speed advantages. Differential storage is more robust and less sensitive to noise and leakage, perhaps allowing for less frequent refreshing. The CAM cell can be pitch-matched to an embedded DRAM, simplifying global layout. Another advantage is an area savings.

While the parent application's CAM cell is area-efficient, using only n-channel transistors, a full voltage swing on the word or row lines is needed to access the cell. Word-line drivers using charge pumps could be used to elevate the word-line voltage above the power-supply voltage, but these pump circuits are complex. Instead, the CAM cell described in the parent application is modified to increase the voltage on the gate of the pass transistors, without using a charge pump. Using locally-pumped nodes for pass transistors allows for higher voltage-drive without external charge pumps. Smaller device sizes can be used for the pass transistors while still allowing sufficient current to flow when charging or discharging the dynamic nodes of the CAM cell.

Alternate Embodiments

Several other embodiments are contemplated by the inventors. For example, many layouts of the cell and device orientations are possible. The cell could be implemented entirely in PMOS rather than in NMOS. Various device sizes may be substituted. Many variations of process technology are known and may be substituted. The word lines and column-select may use boosted voltages from charge pumps for chips with low power-supply voltages. The memory array can be rotated so that rows can run vertically rather than horizontally and columns run horizontally rather than vertically.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A self-booting memory cell with a compare gate comprising:

a pair of bit lines including a true bit line and a complement bit line, for conducting a data bit and a complement of the data bit to the memory cell;

a word line for indicating when to write data from the bit lines to a row containing the memory cell;

a column-select line for indicating when to write data from the bit lines to a column containing the memory cell;

first storage transistor means having a first gate for dynamically storing a state of the memory cell;

second storage transistor means having a second gate for dynamically storing a complement of the state of the memory cell;

first pass transistor means having a gate controlled by a first boosted node, for connecting the true bit line to the first gate during a write operation;

second pass transistor means having a gate controlled by a second boosted node, for connecting the complement bit line to the second gate during the write operation;

first select transistor means, coupled between the word line and the first boosted node, with a gate controlled by the column-select line, for isolating the first boosted node from the word line when the column-select signal is low;

second select transistor means, coupled between the word line and the second boosted node, with a gate controlled by the column-select line, for isolating the second boosted node from the word line when the column-select signal is low;

a match line;

first match transistor means, coupled to the first storage transistor means, for discharging current from the match line to the first storage transistor means during a compare operation, having a gate controlled by a first bit line of the pair of bit lines, the first bit line receiving a test data bit during the compare operation; and second match transistor means, coupled to the second storage transistor means, for discharging current from the match line to the second storage transistor means during the compare operation, having a gate controlled by a second bit line of the pair of bit lines, the second bit line receiving a complement of the test data bit during the compare operation;

whereby the first and second storage transistor means and the first and second match transistor means are a compare gate.

2. The self-booting memory cell of claim 1 wherein the first select transistor means is further for isolating the first boosted node from the word line during a write to the CAM cell;

wherein when the true bit line swings from a low voltage to a high voltage, the true bit line capacitivly couples a voltage boost into the first boosted node, the voltage boost driving the first boosted node above a high voltage of the column-select line to turn off the first select transistor means;

wherein the second select transistor means is further for isolating the second boosted node from the word line during a write to the CAM cell;

wherein when the true bit line swings from a low voltage to a high voltage, the true bit line capacitivly couples a voltage boost into the second boosted node, the voltage boost driving the second boosted node above a high voltage of the column-select line to turn off the second select transistor means, whereby the first or second boosted node is boosted above a high voltage of the column-select line to isolate a boosted gate from the word line.

3. The self-booting memory cell of claim 2 wherein the column-select line is driven to a power-supply voltage as the high voltage, the first boosted node being boosted above the power-supply voltage by capacitive coupling from the true bit line, whereby the first boosted node is boosted above the power-supply voltage by a bit line.

4. The self-booting memory cell of claim 2 wherein the first bit line is the complement bit line;

wherein the second bit line is the true bit line;

wherein the memory cell is written to a high state when the true bit line has a higher voltage than the complement bit line wherein when test data is in the high state, the true bit line is driven with a higher voltage than the complement bit line, whereby the true bit line carries true write data for the write operation and true test data for compare operation, the memory cell being cross-connected.

5. The self-booting memory cell of claim 2 wherein the first bit line is the true bit line;

wherein the second bit line is the complement bit line;

wherein the memory cell is written to a high state when the true bit line has a higher voltage than the complement bit line wherein when test data is in the high state, the complement bit line is driven to a higher voltage than the true bit line, whereby the true bit line carries true write data for the write operation but complement test data for compare operation, the memory cell not being cross-connected.

6. The memory cell of claim 5 wherein the state of the memory cell stored on the first gate of the first storage transistor means is lost after a period of time due to leakage;

wherein the memory cell is periodically re-written with the state to refresh the state of the memory cell before the state is lost, whereby the memory cell is periodically refreshed.

7. A self-booting, dynamic-storage, differential-access content-addressable memory (CAM) cell comprising:

a pair of bit lines including a true bit line and a complement bit line, for conducting a data bit and a complement of the data bit to the CAM cell;

a word line for indicating when to write data from the bit lines to the CAM cell;

a first storage transistor having a first gate for dynamically storing a state of the CAM cell;

a second storage transistor having a second gate for dynamically storing a complement of the state of the CAM cell;

a first pass transistor having a gate controlled by a first boosted node, for connecting the true bit line to the first gate during a write operation;

a second pass transistor having a gate controlled by a second boosted node, for connecting the complement bit line to the second gate during the write operation;

a first select transistor having a gate controlled by a column-select signal, for connecting the word line to the first boosted node;

a second select transistor having a gate controlled by the column-select signal, for connecting the word line to the second boosted node;

a match line;

a first match transistor, coupled to the first storage transistor, for discharging current from the match line to the first storage transistor during a compare operation, having a gate controlled by a first bit line of the pair of bit lines, the first bit line receiving a test data bit during the compare operation; and a second match transistor, coupled to the second storage transistor, for discharging current from the match line to the second storage transistor during the compare operation, having a gate controlled by a second bit line of the pair of bit lines, the second bit line receiving a complement of the test data bit during the compare operation;

wherein when the first storage transistor is charged when the CAM cell was written to a high state, the match line is discharged to indicate a mis-match when the first match transistor is activated by the first bit line being in a high state;

wherein when the second storage transistor is charged when the CAM cell was written to a low state, the match line is discharged to indicate a mis-match when the second match transistor is activated by the second bit line being in a high state;

wherein the match line remains high when the test data bit matches the state of the CAM cell, whereby the CAM cell has eight transistors.

8. The self-booting, dynamic-storage, differential-access CAM cell of claim 7:

wherein the first bit line is the complement bit line;

wherein the second bit line is the true bit line;

wherein the CAM cell is written to the high state when the true bit line has a higher voltage than the complement bit line wherein when the test data is in the high state, the true bit line is driven with a higher voltage than the complement bit line, whereby the true bit line carries true write data for the write operation and true test data for compare operation, the CAM cell being cross-connected.

9. The self-booting, dynamic-storage, differential-access CAM cell of claim 7:

wherein the first bit line is the true bit line;

wherein the second bit line is the complement bit line;

wherein the CAM cell is written to the high state when the true bit line has a higher voltage than the complement bit line wherein when the test data is in the high state, the complement bit line is driven to a higher voltage than the true bit line, whereby the true bit line carries true write data for the write operation but complement test data for compare operation, the CAM cell not being cross-connected.

10. The self-booting, dynamic-storage, differential-access CAM cell of claim 9:

wherein the state of the CAM cell stored on the first gate of the first storage transistor is lost after a period of time due to leakage;

wherein the CAM cell is periodically re-written with the state to refresh the state of the CAM cell before the state is lost, whereby the CAM cell is periodically refreshed.

11. The self-booting, dynamic-storage, differential-access CAM cell of claim 10 wherein the first and second storage transistors, the first and second pass transistors, the first and second select transistors, and the first and second match transistors are all n-channel metal-oxide-semiconductor (NMOS) transistors, wherein the CAM cell contains no p-channel transistors, whereby the CAM cell is an 8T all-NMOS cell.

12. The self-booting, dynamic-storage, differential-access CAM cell of claim 11 wherein:

the first boosted node is driven above a power-supply voltage by capacitive coupling from the true bit line when the true bit line is driven from ground to a higher voltage during a write-1 operation, but the second boosted node is driven above the power-supply voltage by capacitive coupling from the complement bit line when the complement bit line is driven from ground to a higher voltage during a write-0 operation, whereby the first or second boosted nodes are driven above the power-supply voltage by capacitive coupling during write operations.

13. The self-booting, dynamic-storage, differential-access CAM cell of claim 12 wherein the first or second boosted nodes are boosted above the power-supply voltage while the word line is driven higher than the power-supply voltage, whereby the CAM cell has a locally-boosted node without a word-line change pump.

14. The self-booting, dynamic-storage, differential-access CAM cell of claim 12 wherein the match line is precharged to a high voltage before each compare operation.

15. The self-booting, dynamic-storage, differential-access CAM cell of claim 10 further comprising:

a pair of read bit lines including a true read bit line and a complement read bit line, for differentially sensing the state of the CAM cell during a read operation;

a read word line for indicating when a read operation is reading the state of the CAM cell;

a first read transistor, having a gate controlled by the read word line, for connecting a drain of the first storage transistor to the true read bit line during the read operation; and a second read transistor, having a gate controlled by the read word line, for connecting a drain of the second storage transistor to the complement read bit line during the read operation, whereby the drains of the first and second storage transistors are sensed during the read operation, the CAM cell containing 10 transistors.

16. A method of writing a memory cell using a self-booting node comprising:

driving a high voltage to gates of select transistors;

driving a word line from a low voltage to a high voltage;

coupling the high voltage on the word line to a first and a second boosted node through the select transistors;

driving both of a pair of bit lines to the low voltage;

after the first and second boosted nodes have been coupled to the high voltage on the word line, driving a first of the bit lines to a higher voltage;

capacitivly coupling a voltage boost from the first of the bit lines to the first boosted node when the higher voltage is driven to the first of the bit lines;

wherein the first boosted node is driven above the high voltage by capacitive coupling from the first of the bit lines;

wherein the select transistor coupled between the first boosted node and the word line isolates the first boosted node from the word line when the first boosted node is boosted above the high voltage;

transferring a high charge from the first of the bit lines to a first storage gate through a pass transistor that has its gate connected to the first boosted node; and driving the low voltage onto the word line, the select transistors coupling the low voltage to the boosted nodes, the pass transistor isolating the high charge on the first storage gate, whereby the memory cell is written through the pass transistor with the gate boosted above the high voltage.

17. The method of claim 16 wherein the low voltage is ground and the high voltage is a power-supply voltage, whereby the first boosted node is driven above the power-supply voltage by capacitive coupling from the bit line while the word line is driven only to the power-supply voltage.

18. The method of claim 17 wherein the higher voltage driven to the first of the bit lines is between the power-supply voltage and ground, wherein the first of the bit lines is driven from ground to an intermediate voltage.

19. The method of claim 16 further comprising:

when the bit lines are driven to the low voltage, transferring a low charge from the second of the bit lines to a second storage gate through a second pass transistor that has its gate connected to the second boosted node; and when the low voltage is driven onto the word line, and the select transistors couple the low voltage to the boosted nodes, the second pass transistor isolates the low charge on the second storage gate, whereby a differential charge is stored by the memory cell.

20. The method of claim 19 further comprising:

performing a compare operation by driving true an complement test data onto the bit lines;

driving the low voltage to the word line while the high voltage is driven to the gates of the select transistors, wherein the first and second boosted nodes are driven to the low voltage to isolate the first and second storage gates from the bit lines;

discharging a match line to ground through a first match transistor in series with a first storage transistor controlled by the first storage gate, or discharging the match line to ground through a second match transistor in series with a second storage transistor controlled by the first storage gate when the test data does not match data stored on the first and second storage gates wherein the first and second match transistors have gates connected to the bit lines, whereby a compare operation is performed.

* * * * *

UNITED STATES PATENT AND TRADEMARK OFFICE
CERTIFICATE OF CORRECTION

PATENT NO. : 6,078,513
DATED : June 20, 2000
INVENTOR(S) : Ong et al.

Page 1 of 1

It is certified that error appears in the above-identified patent and that said Letters Patent is hereby corrected as shown below:

Column 2,
Line 41, "28" should read --26 --.
Line 50, "n-channel transistor 21" should read -- p-channel transistor 21.

Column 5,
Line 31. "true bit line" should read -- complement bit line --.
Line 32, "true bit line" should read -- complement bit line --.

Column 6,
Line 40, "34" should read --42 --.
Line 43, " VD-DVt32" should read -- VDD-Vt50 --.
Line 44, "Vt42" should read --Vt52 --.

Column 7,
Line 10, "34, 44" should read -- 36, 46 --.
Line 26, "stored data is high" should read -- stored data is low --.
Line 27, "test data is low" should read -- test data is high --.

Column 9,
Line 43, "transistor 38" should read -- transistor 34 --.
Line 45, "transistor 48" should read -- transistor 44 --.

Column 11,
Line 47, "true bit line" should read -- complement bit line --.
Line 48, "true bit line" should read -- complement bit line --.

Signed and Sealed this

Eleventh Day of September, 2001

*Attest:*

*Nicholas P. Godici*

*Attesting Officer*

NICHOLAS P. GODICI
*Acting Director of the United States Patent and Trademark Office*